FUNCTION OSCILLATOR

Filed Jan. 7, 1958

INVENTOR
JOSEPH B. NAINES, JR.
BY Harold T. Stowell
Harold L. Stowell
ATTORNEYS

April 18, 1961 J. B. NAINES, JR 2,980,866

FUNCTION OSCILLATOR

Filed Jan. 7, 1958 2 Sheets-Sheet 2

INVENTOR

JOSEPH B. NAINES, JR.

BY Harold T. Stowell

Harold L. Stowell

ATTORNEYS

United States Patent Office 2,980,866
Patented Apr. 18, 1961

2,980,866

FUNCTION OSCILLATOR

Joseph B. Naines, Jr., Skokie, Ill., assignor to Research Corporation, New York, N.Y., a corporation of New York Filed Jan. 7, 1958, Ser. No. 707,540

1 Claim. (Cl. 331—135)

The present invention relates to an electronic oscillator and, more particularly, to a self-sustained wave generator capable of producing triangular and square wave forms.

The oscillator of the present invention has many applications in the electronic field and typically enjoys great usefulness in analog computer operational systems where a driving function of a square or triangular shape is considered a desideratum.

It is a primary object of the present invention to produce an electronic oscillator wherein the cycle time, height, width, rise and fall rates of the resultant wave shapes may be readily varied.

Another object of the invention is to produce an electrical oscillator which comprises a minimum of circuit components yet exhibits extreme stability.

A further object of the invention is to produce an electrical oscillator capable of generating triangular and square wave forms which is characterized by its simplicity and the resultant case of assembly and construction.

The objectives of the present invention may be achieved by the employment of a voltage limited differentiator circuit which includes a high gain amplifier; and a voltage limited integrator circuit which includes a high gain amplifier. The square wave output of the differentiator circuit is fed directly to the integrator circuit whose triangular wave output is fed back to the input of the differentiator circuit. The output of integrator will be increasingly positive when its input or the output of the differentiator is negative and vice versa. By virtue of the novel circuit arrangement, an oscillator has been produced which is capable of sustained operation having constant square and triangular wave form outputs.

These and other objects of the invention will become manifest from reading the following detailed description in connection with the attached drawings in which:

Figures 3*a* and 3*b* show typical wave forms generated by the oscillator of the invention.

Figure 1:
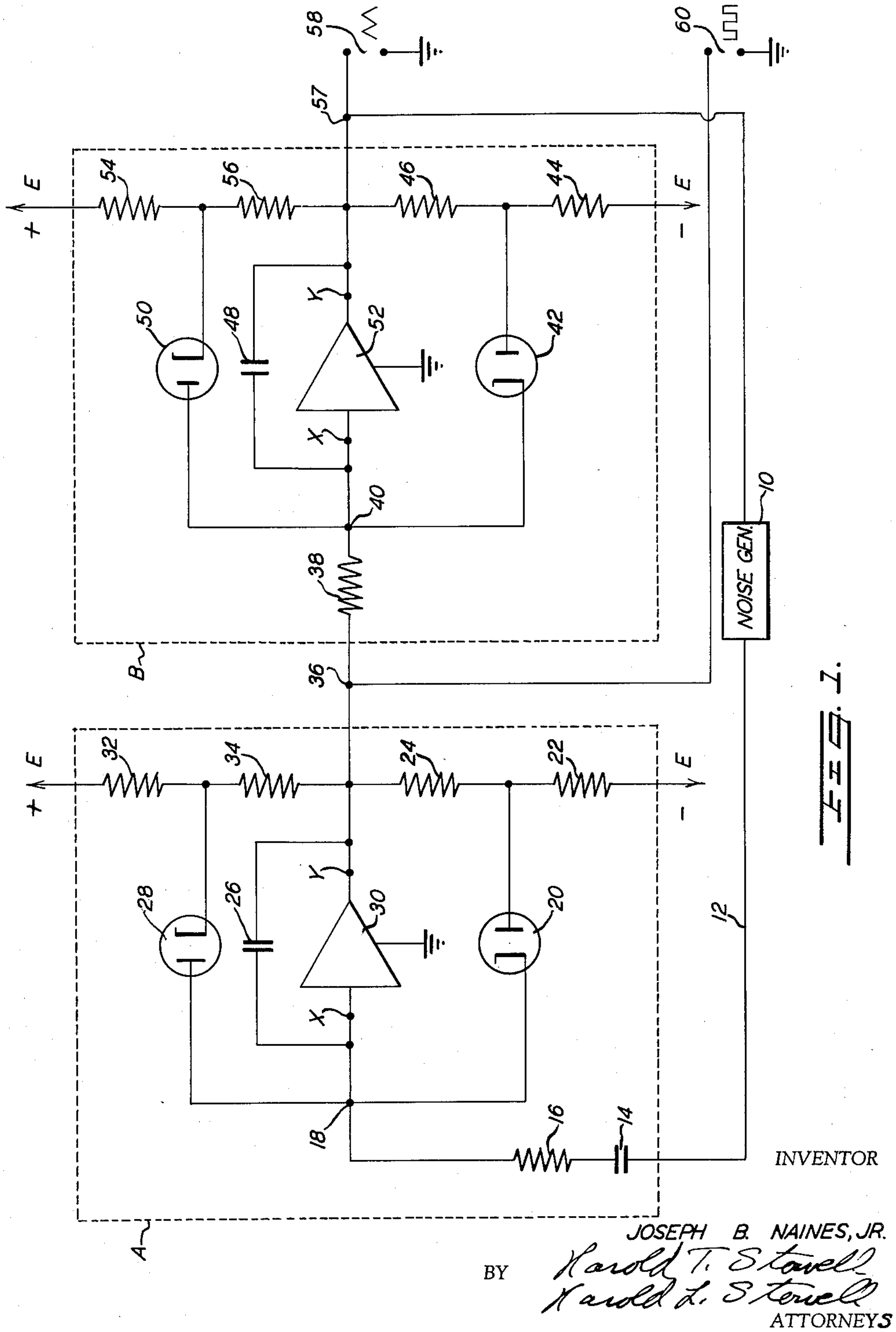
Figure 1 is a circuit diagram of the oscillator of the present invention.

Referring to Figure 1, there is shown an embodiment of the invention which includes a noise source or generator 10 capable of producing random energy pulses. The output of a noise generator such as illustrated at 10 is comprised of a plurality of voltage "spikes." Typically, there are substantially an even number of positive and negative "spikes" or signals. The output of the noise source 10 is coupled to a portion of the circuit which may be referred to as a voltage limited differentiator generally indicated as A and defined by dotted lines in Figure 1 through a conductor 12. A differentiating condenser 14 and a current limiting resistor 16 are connected in series with the conductor 12 between the noise source 10 and the point 18 of the voltage limited differentiator A.

A diode 20 such as 6AL5 is connected between point 18 and the midpoint of a voltage divider network comprised of resistors 22 and 24. A similar diode 28 is connected between point 18 and a second voltage divider network comprised of resistors 32 and 34.

An operational amplifier 30 having infinite gain characteristics is coupled between the output 36 of the voltage limited differentiator A and the point 18 and has a stabilizing capacitor 26 coupled across it. The value of the capacitor 26 is very small in comparison with the capacitor 14 and its presence may be of particular importance when the amplifier 30 is a very high gain type. The capacitor 26 is then used for stability from high frequency oscillations. Since the capacitance of the capacitor 26 is very small, sufficient capacitance is usually provided by the stray capacitance of the circuit.

A second portion of the circuit of the present invention which is referred to as the voltage limited integrator generally indicated as B and defined by dotted lines in Fig. 1 is coupled to the output 36 of the voltage limited differentiator A. More specifically, the output point 36 is coupled to the input point 40 through a resistor 38.

A diode 42, such as a 6AL5 is connected between point 40 and the midpoint of a voltage divider network comprised of resistors 44 and 46. A similar diode 50 is connected between point 40 and the midpoint of a voltage divider network comprised of resistors 54 and 56.

An operational amplifier 52 having high gain characteristics is coupled between the output 57 of the voltage limited integrator B and the input point 40 and has an integrating capacitor 48 coupled across it.

Figures 2, 3:
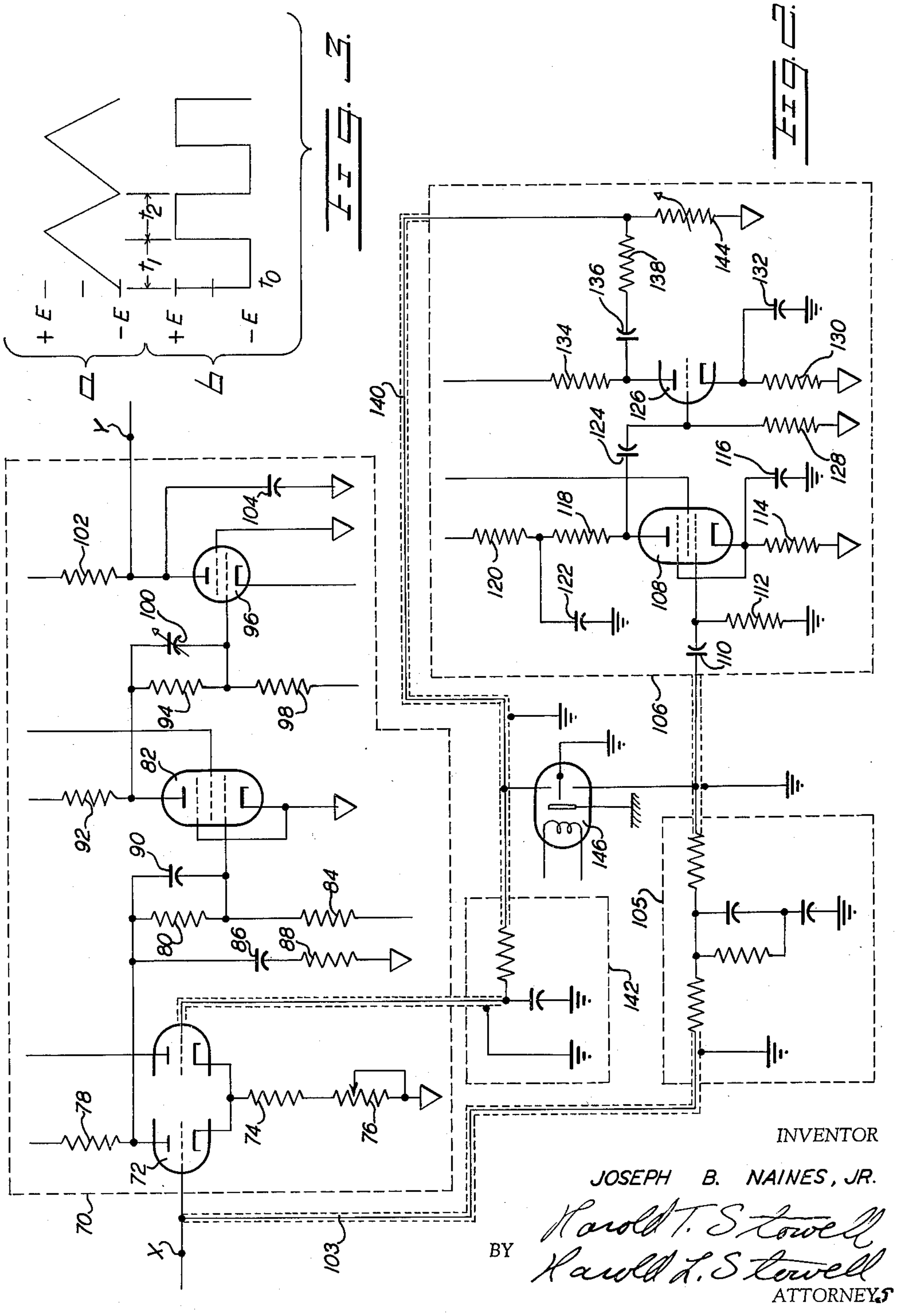
Figure 2 is a circuit diagram of a typical operational amplifier which may be satisfactorily employed in the present oscillator.

The operational amplifiers 30 and 52 may be identical and are D.C. in nature. Preferably they are linear high gain amplifiers with zero output voltage for zero input voltage. Figure 2 is a circuit diagram of a typical amplifier which can be satisfactorily employed to achieve the desired objectives of the present invention. Basically the amplifier illustrated in Figure 2 is composed of a three-stage direct coupled amplifier 70 with a chopper 146 and a two-stage resistance-capacitance coupled amplifier 106 for drift stabilization of the D.C. section.

The operational amplifiers 30 and 52 are connected into the circuit shown in Figure 1 between points X and Y, point X indicating generally the input of the amplifiers and point Y indicating the output of the amplifiers.

Specifically, the D.C. amplifier generally indicated at 70 has three stages of amplification. The first stage comprises an amplifier tube 72 which may be a 12AU7 vacuum tube, the first half functioning as the signal input and the second half as an error compensation input. The cathode of the tube 72 is connected to power ground through a fixed cathode resistor 74 for bias and a potentiometer 76 for bias adjustment. The plate of the first stage of the tube 72 is connected to its power through a high value plate resistance 78.

A resistor 80 is employed to directly couple the output of tube 72 to the second stage of the amplifier 70 which is comprised of amplifier tube 82. Tube 82 may be a sharp cutoff pentode such as a 6AU6 vacuum tube. Biasing voltage for the tube 82 is received from a power supply through a biasing resistor 84. A condenser 86 and a resistor 88 provide high frequency filtering, while a condenser 90 corrects for oscillation instability. The plate of the tube 82 is connected to its power supply through a plate resistor 92. The cathode and screen grid of the tube 82 is coupled to power ground through a suitable conductor.

A resistor 94 couples the second stage of the D.C. amplifier 70 with an amplifier tube 96 of the third stage. The amplifier tube 96 may typically be a power amplifier tube such as the type designated as 6V6. A resistor 98 is connected to the control grid of tube 96 to provide a suitable bias. A variable trimmer condenser 100 is connected in parallel with the coupling resistor 94 and is provided for the correction of amplifier instability. The plate of the third stage or output tube 96 is connected to its power supply through a plate resistor 102. High frequency filtering is effectively accomplished by providing a condenser 104 between the output of the tube 96 and power ground. The cathode of the tube 96 is connected to a power supply through a suitable conductor while the screen grid is connected to power ground.

The A.C. amplifier stage 106 of the operational amplifiers 30 and 52 has two stages of amplification; the first stage comprises an amplifier tube 108 which typically may be a sharp cut-off pentode designated as 6AU6 and the second stage comprises one-half of a dual triode 126 designated as 12AX7.

The input side of the A.C. amplifier stage 106 is coupled to the input X through a shielded conductor 103, and a coupling condenser 110 to the control grid of the amplifier tube 108. An input grid resistor 112 is connected between the control grid of tube 108 and signal ground. A bias resistor 114 is employed to provide a bias to the tube 108. A cathode by-pass condenser 116 is provided between the cathode of tubes 108 and signal ground. The plate of tube 108 is connected to an appropriate power supply through a plate resistor 118. The resistor 120 and the condenser 122 are provided in the plate circuit and function as plate circuit decoupling means.

The output of the first stage of the amplifier 106 is coupled to the amplifier tube 126 of the second stage through a coupling condenser 124. An input grid resistor 128 is connected between power ground and the control grid of the tube 126. A bias resistor 130 is connected between the cathode of the tube 126 and power ground while a cathode by-pass condenser 132 is provided between the cathode and signal ground. The plate of the tube 126 is connected to a suitable power supply through a plate resistor 134.

The output of the second stage of the A.C. amplifier 106 is coupled to the second half of the tube 72 of the D.C. amplifier 70 through a coupling condenser 136, a resistor 138, a shielded conductor 140, and filter 142. A thyrite resistor 144 is employed to control the saturation level of the amplifier.

A chopper 146 is connected into the circuit between the output side of filter 105 and the input side of filter 142 and functions to provide a carrier and comparison signal and operates at 60 cycles per second. It operates essentially as a single pole double-throw relay making and breaking alternate contacts at a 60 times per second rate.

*Operation*

The operation of the system is initiated by the injection of white noise into the system by the noise generator 10. It must be understood that the energy level of the noise or the output of the noise generator 10 is generally much less than the energy level of the signal derivatives to the differentiator current A. In certain applications the noise level of the system will suffice. In any event, the signal derivative to the differentiator circuit A should predominate the noise signals during integration periods. Let it be assumed that initially a positive voltage "spike" or signal is passed through the differentiating condenser 14 and thence through the current limiting resistor 16 thereby causing the output of the voltage limited differentiator circuit A at point 36 to go infinitely negative. This is due to the fact that the amplifier 30 has substantially infinite gain. It will be understood, however, that the output of amplifier 30 is limited by the values of the power supply voltage E, and the values of the resistors 22, 24, 32, and 34. Therefore, the negative output voltage at point 36 is determined by the following relationship:

$$+\text{E multiplied by } \frac{\text{resistance of value 34}}{\text{resistance of value 32}}$$

if we assume a positive voltage signal initially. Normally, both diodes 20 and 28 are non-conducting, however when the output of the amplifier 30 is such as to cause the plate of the diode 20 to become positive with respect to the cathode the diode 20 starts to conduct stopping all further differentiation by the differentiator circuit A.

Now, we can consider that the voltage at the point 36 and the output terminals 60 will be at a minus voltage limit as shown graphically in Figure 3*b* at time $t_0$. This voltage signal is then fed into the voltage limited integrator B which will perform an integrating function positively until a voltage level is reached which is determined by $$-\text{E multiplied by } \frac{\text{resistance value of 46}}{\text{resistance value of 44}}$$

at which point diode 42 starts to conduct preventing any further integration. During the positive integration cycle $t_1$, the voltage at the output terminals 58 has been increasing in a positive direction as illustrated in Figure 3*a*. It will be noted from an examination of Figure 3*a* that the output wave form, at point 57, has been increasing positively during time cycle $t_1$ hence the voltage at output point 57 has been uniformly increasing, then the operational amplifier 30 will see the derivative of this voltage which is positive. When diode 42 commences to conduct, the voltage limited integrator B has reached its integration limit. When this limit is reached, the derivative or output of the integrator B at point 57 becomes zero, and thus the voltage input to amplifier 30 is zero.

The operational amplifier 30 is unstable with zero input and, therefore, the mode of operation that the amplifier will assume is determined essentially by the noise of the system. At any instant of time, the noise developed by the noise generator 10 has an equal probability of being positive or negative.

Inasmuch as a positive voltage signal was employed to energize the system for the time cycle $t_1$ resulting in a negative output voltage at point 36, a negative signal is now necessary to sustain the operation of the system. Manifestly, a positive voltage signal from the noise generator 10 would not effect the circuit. Accordingly, at the start of time cycle $t_2$ the next negative signal from the noise generator is fed into the operational amplifier 30. At this moment the voltage across the diodes 20 and 28 is such that both are non-conducting. However, upon receipt of the incoming negative voltage signal, the differentiator A commences operation and the voltage across the system is such as to cause the plate of the diode 20 to go positive with respect to its cathode thereby commencing conduction. The resultant output of differentiator A at point 36 is positive as is illustrated in Figure 3*b* and remains clamped in such state until the voltage of the system causes the diode 28 to cease conduction.

The positive output signal from the differentiator circuit A is fed to the integrator circuit B and is there impressed on the input of the amplifier 52. The diodes 42 and 50, the power supply E, and the values of the resistances 44, 46, 54, and 56 are such that each diode is normally non-conductive. However, upon receipt of the positive output signal from the differentiator circuit A, the integrator circuit B integrates downwardly to the lower integration limit which is determined by the following relationship:

$$+\text{E multiplied by } \frac{\text{resistance value of 56}}{\text{resistance value of 54}}$$

Now, it will be seen that the output signal at point 57 is a constantly decreasing voltage, during time cycle $t_2$; therefore, the amplifier 30 will see a negative voltage and its output will be constantly positive as illustrated in Figures 3*a* and 3*b*.

The above action is cyclically repeated resulting in a series of triangular wave forms appearing at the output terminals 58 and a series of square wave forms at output terminals 60.

It is an important feature of the present invention and essential to its operation that the signal output voltage from the integrator B taken at point 57 is fed back to the input of the differentiator A.

From the foregoing description of the circuit components and their function, it will be appreciated that the function of the amplifier 30 is to merely provide a high gain for the amplification of the input signal. A constant output may be assured by limiting the output to a level below the amplifier gain times the input signal. The input signal is constant by virtue of being the time derivative of the triangular wave output from the integrator circuit B. The amplifier 52 of the integrator circuit B supplies the gain necessary to insure a time integration operation on the constant voltage output from the differentiator circuit A.

The rise rate of the triangular wave may be changed by varying the value of the resistor 34. Similarly, the fall rate may be changed by varying the value of resistor 24. The time intervals $t_1$ and $t_2$ are functions of the clipping levels of the power supply voltage E which may be modified by varying the values of the resistors 46 and 56, and also the rise and fall rates. By varying the values of the resistors 16, 38, and the condensers 14 and 48, the oscillation frequency may be made to vary from 1 cycle per hour to 1000 cycles per second.

While the embodiment of the invention illustrated in Figure 1 shows a noise generator 10, it must be understood that the desired objectives of the invention may likewise be achieved by the employment of any source of fluctuating electric potential. It must also be understood that in practice, the feedback resistance of the differentiator circuit A is the resistance of the open circuit when the diodes 20 and 28 are non-conductive, or the leakage resistance of the diodes 20 and 28 and the amplifier 30.

I claim:

Apparatus for generating sustained square and triangular wave forms comprising a noise generator having an input and an output for producing periodic random pulses of positive and negative potential, first circuit means having an input and an output and including a voltage limited differentiating means producing a substantially square wave output, second circuit means having an input and an output including a voltage limited integrating means producing a substantially triangular wave output, circuit elements coupling the output of said first circuit means to the input of the second circuit means, and circuit elements including said noise generator connected between the output of said second circuit means and the input of said first circuit means whereby energy pulses from the output of said second circuit means are fed back to the input of said first circuit means through said noise generator to provide periodic random pulses of positive and negative potential to the input of said first circuit means thereby to sustain the operation of the apparatus.

References Cited in the file of this patent

UNITED STATES PATENTS

| | | |
|---|---|---|
| 2,748,272 | Schrock | May 27, 1956 |
| 2,846,577 | Blasingame | Aug. 5, 1958 |

OTHER REFERENCES

"A Two-Phase Low Frequency Oscillator," by E. F. Good, in Electronic Engineering, pages 164–169, April 1957.